United States Patent
Giacoma et al.

(10) Patent No.: US 7,222,660 B2
(45) Date of Patent: May 29, 2007

(54) CABINET WITH AN ENVIRONMENTALLY-SEALED AIR-TO-AIR HEAT EXCHANGER

(75) Inventors: Lawrence M. Giacoma, Plano, TX (US); David Michael Austin, Plano, TX (US); Daniel J. Calanni, Plano, TX (US)

(73) Assignee: Tellabs Petaluma, Inc., Petaluma, CA (US)

( * ) Notice: Subject to any disclaimer, the term of this patent is extended or adjusted under 35 U.S.C. 154(b) by 0 days.

(21) Appl. No.: 10/957,908

(22) Filed: Oct. 4, 2004

(65) Prior Publication Data

US 2006/0070718 A1    Apr. 6, 2006

(51) Int. Cl.
*H05K 7/20*    (2006.01)
(52) U.S. Cl. .............. 165/47; 165/104.33; 165/104.34; 165/122; 165/166; 361/695; 361/696; 361/697; 361/690; 454/184; 312/236
(58) Field of Classification Search ........... 165/104.33, 165/104.34, 166, 122, 80.3, 47; 361/695, 361/696, 697, 690; 454/184; 312/236
See application file for complete search history.

(56) References Cited

U.S. PATENT DOCUMENTS

| | | | | |
|---|---|---|---|---|
| 4,386,651 A | * | 6/1983 | Reinhard | 165/104.33 |
| 4,949,218 A | * | 8/1990 | Blanchard et al. | 361/696 |
| 5,054,545 A | * | 10/1991 | Ghaemian | 165/104.33 |
| 5,603,376 A | * | 2/1997 | Hendrix | 165/104.34 |
| 6,105,875 A | * | 8/2000 | LaGrotta et al. | 236/44 A |
| 6,598,668 B1 | * | 7/2003 | Cosley et al. | 165/104.32 |
| 6,704,198 B2 | * | 3/2004 | Replogle et al. | 361/690 |
| 2004/0007348 A1 | * | 1/2004 | Stoller | 165/47 |

FOREIGN PATENT DOCUMENTS

| | | | |
|---|---|---|---|
| DE | 29605555 U1 | * | 8/1996 |
| JP | 04062378 A | * | 2/1992 |
| JP | 2001267774 A | * | 9/2001 |

OTHER PUBLICATIONS

U.S. Appl. No. 10/821,288, filed Apr. 9, 2004, Fernandez et al.

* cited by examiner

*Primary Examiner*—John K. Ford
(74) *Attorney, Agent, or Firm*—Mark C. Pickering

(57) ABSTRACT

A cabinet which utilizes an air-to-air heat exchanger to remove heat generated from within the cabinet prevents water and dust from entering the air-to-air heat exchanger by forcing cooler external air up along a first side wall, through the air-to-air heat exchanger, and down along a second side wall.

8 Claims, 3 Drawing Sheets

CABINET WITH AN ENVIRONMENTALLY-SEALED AIR-TO-AIR HEAT EXCHANGER

BACKGROUND OF THE INVENTION

1. Field of the Invention

The present invention relates to cabinets and, more particularly, to a cabinet with an environmentally-sealed air-to-air heat exchanger.

2. Description of the Related Art

Telecommunication circuits, such as line cards, are commonly housed in electronics cabinets that sit outside in residential and commercial neighborhoods. The cabinets are water tight and air tight to prevent water and dust from entering the cabinets and reducing the useful life of the line cards inside the cabinets.

One trend in the telecommunications industry is to make line cards that provide more than basic plain old telephone service (POTS), such as line cards that provide both basic POTS and XDSL broadband data service. Line cards which provide more than basic POTS, however, tend to consume more power and generate more heat than basic POTS cards.

Thus, as the power consumption of the line cards increases, more and more heat must be removed from inside the cabinets, where the equipment is housed and operates. Since the cabinets are air tight and water tight, heat removal must take place through a boundary surface by using, for example, an air-to-air heat exchanger.

FIG. 1 shows a perspective view that illustrates a prior-art electronics cabinet 100. As shown in FIG. 1, cabinet 100 includes a base plate 110, a top plate 112, and a number of side walls 114 that are connected to base plate 110 and top plate 112. In addition, cabinet 100 includes a rack 116 that holds telecommunication equipment, and a first door 118 that is connected to a side wall 114 via hinges or other rotational means to provide access to the interior of cabinet 100.

As further shown in FIG. 1, electronics cabinet 100 includes a second door 118A, and an air-to-air heat exchanger 120. Second door 118A, which has a large opening formed through door 118A, is also connected to a side wall 114 via hinges or other rotational means to further provide access to the interior of cabinet 100. Air-to-air heat exchanger 120, in turn, sits entirely within the opening of second door 118A.

However, one problem with a conventional door-mounted air-to-air heat exchanger, such as heat exchanger 120, is that water and dust can enter the external air flow path of the heat exchanger. As a result, when the heat exchanger or the installation of the heat exchanger is defective, such as when the sealant was improperly applied, the defect can allow water and dust to be introduced into the inside of the cabinet.

Thus, there is a need for an environmentally-sealed air-to-air heat exchanger that prevents the introduction of water and dust into the inside of the cabinet, even when the heat exchanger or the installation of the heat exchanger is defective.

SUMMARY OF THE INVENTION

An electronics cabinet is disclosed in accordance with the present invention. A first embodiment of the electronics cabinet includes an enclosure that has a bottom surface, a top surface with an opening formed through the top surface, a first side wall connected to the bottom and top surfaces, and a second side wall connected to the bottom and top surfaces. The first and second side walls are substantially vertical. The electronics cabinet also includes a first air channel that contacts the first side wall, and a second air channel that contacts the second side wall. In addition, the electronics cabinet includes a heat exchanger. A portion of the heat exchanger extends through the opening in the top surface.

A second embodiment of the electronics cabinet includes an enclosure that has a bottom surface, a top surface with an opening formed through the top surface, a front side wall that is connected to the bottom and top surfaces, a back side wall that is connected to the bottom and top surfaces, a first interior side wall that is connected to the front and back side walls, and a second interior side wall that is connected to the front and back side walls. The first and second interior side walls are substantially vertical. The electronics cabinet also includes a first exterior side wall that is connected to the front and back side walls to form a first air channel between the first interior and first exterior side walls, and a second exterior side wall that is connected to the front and back side walls to form a second air channel between the second interior and second exterior side walls. In addition, the electronics cabinet includes a heat exchanger. A portion of the heat exchanger extends through the opening in the top surface.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIG. 2A is a top-side perspective view, FIG. 2B is a bottom-side perspective view, and FIG. 2C is a cross-sectional view taken along plane 2C-2C of FIGS. 2A-2B.

DETAILED DESCRIPTION OF THE INVENTION

Figure 1:
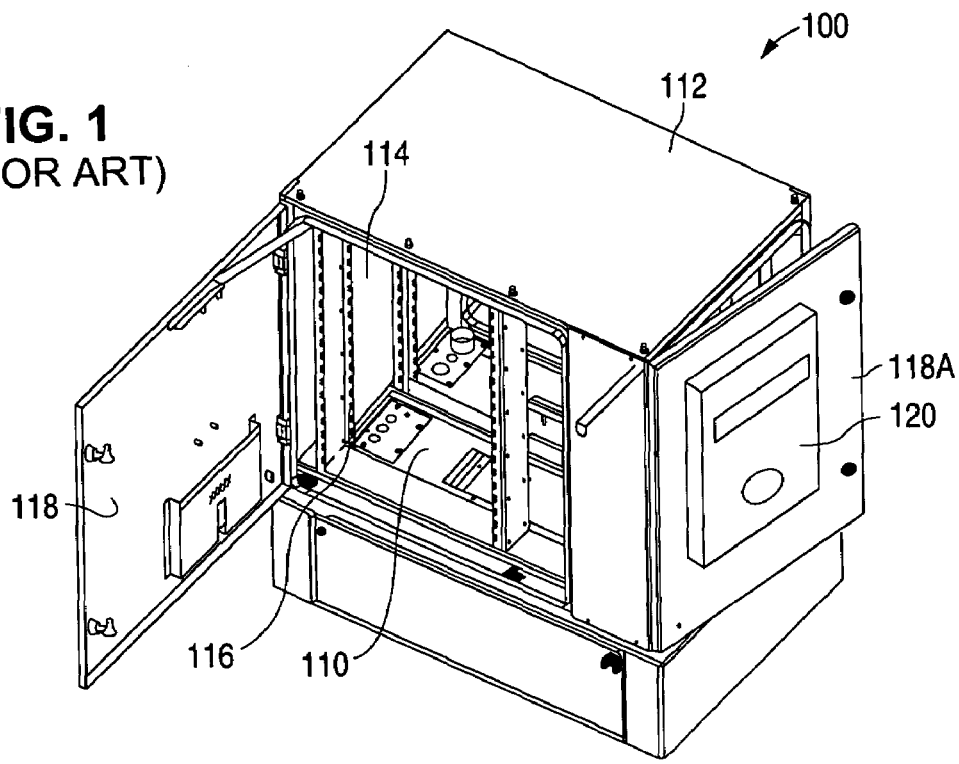
FIG. 1 is a perspective view illustrating a prior-art electronics cabinet 100.
Figure 2A:
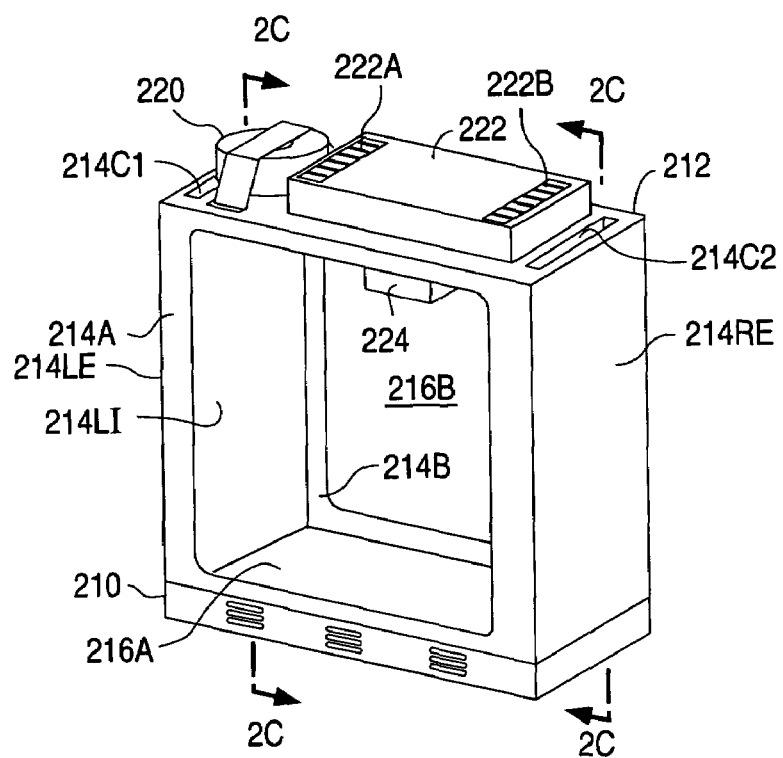
FIGS. 2A-2C are views illustrating an example of an electronics cabinet 200 in accordance with the present invention.
Figure 2B:
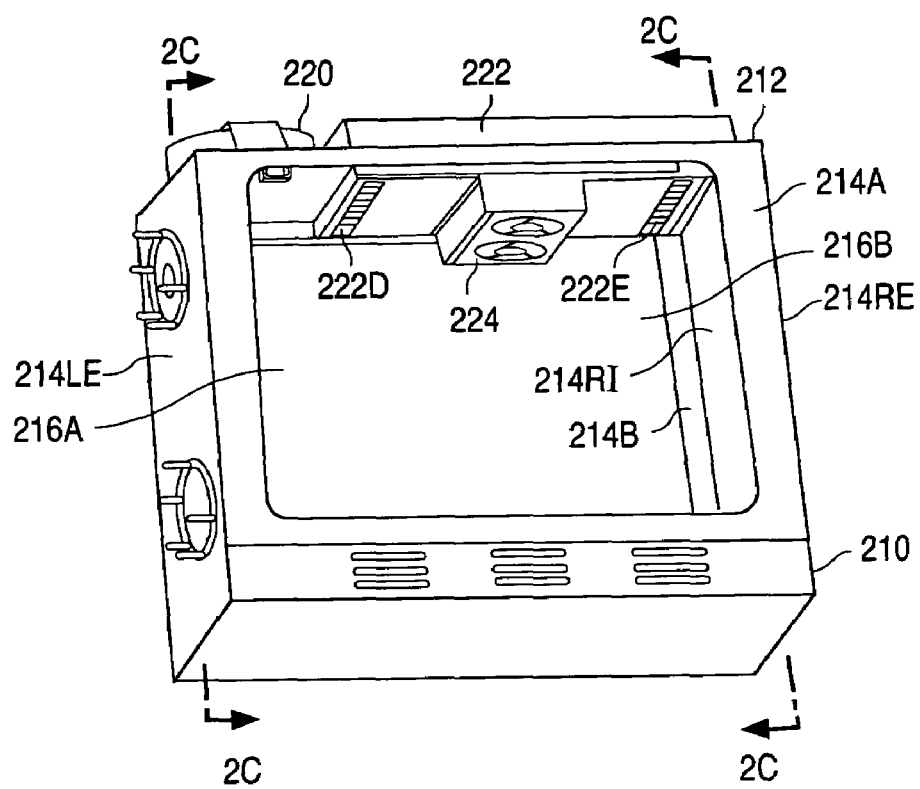
Figure 2C:
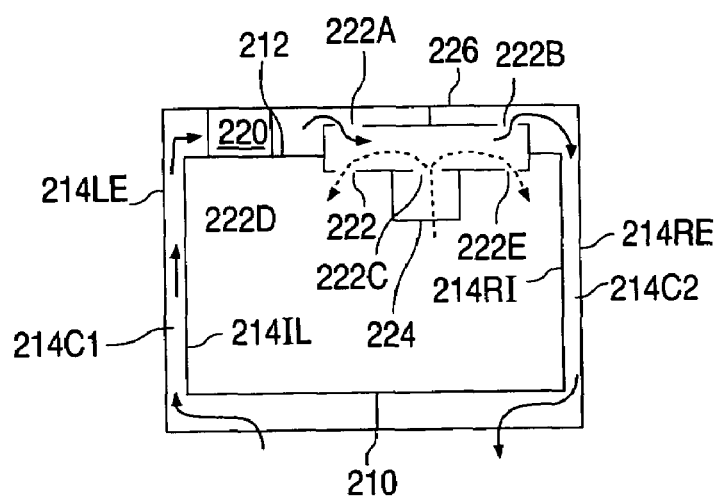

FIGS. 2A-2C show views that illustrate an example of an electronics cabinet 200 in accordance with the present invention. FIG. 2A shows a top-side perspective view, FIG. 2B shows a bottom-side perspective view, and FIG. 2C shows a cross-sectional view taken along plane 2C-2C of FIGS. 2A-2B.

As described in greater detail below, electronics cabinet 200 prevents water and dust from entering an air-to-air heat exchanger, which removes heat generated from telecommunications line cards within cabinet 200, by forcing cooler external air up along a first side wall, through the air-to-air heat exchanger, and down along a second side wall.

As shown in FIGS. 2A-2C, electronics cabinet 200 includes a base 210 and a top surface 212. In addition, electronics cabinet 200 includes a front side wall 214A and a back side wall 214B that are connected to base 210 and top surface 212. As further shown in FIGS. 2A-2B, front side wall 214A and a back side wall 214B have large openings 216A and 216B, respectively.

Openings 216A and 216B, in turn, accommodate a front side door and a back side door, respectively. Although not shown in FIGS. 2A-2C, when the front side door and the back side door are attached to front and back side walls 214A and 214B, respectively, and then closed, cabinet 200 forms a water-tight and an air-tight enclosure.

Further, electronics cabinet 200 includes an exterior left side wall 214LE that is connected to base 210, top surface 212, front side wall 214A, and back side wall 214B. In addition, cabinet 200 includes an exterior right side wall 214RE that is connected to base 210, top surface 212, front side wall 214A, and back side wall 214B.

In accordance with the present example of the invention, electronics cabinet 200 includes an interior left side wall 214LI that is connected to base 210, top surface 212, front side wall 214A, and back side wall 214B to form a first air channel 214C1. The first air channel 214C1 is defined between the left exterior and interior side walls 214LE and 214LI, and the front and back side walls 214A and 214B.

Cabinet 200 also includes an interior right side wall 214RI that is connected to base 210, top surface 212, front side wall 214A, and back side wall 214B to form a second air channel 214C2. The second air channel 214C2 is defined between the right exterior and interior side walls 214RE and 214RI, and the front and back side walls 214A and 214B.

In addition, electronics cabinet 200 includes an external fan 220 that is connected to top surface 210, and an air-to-air heat exchanger 222 that is connected to, and extends through, top surface 210. Heat exchanger 222 has two exterior openings: a first exterior opening 222A that lies close to external fan 220, and a second exterior opening 222B that lies spaced-apart from external fan 220. Heat exchanger 222 also has three interior openings: a central opening 222C, a first end opening 222D, and a second end opening 222E.

Electronics cabinet 200 additionally includes an internal fan 224 that is connected to the center opening 222C of heat exchanger 222. Further, although shown only in the cross-sectional view of FIG. 2C, cabinet 200 includes a top cover 226 that contacts top surface 210, the side walls 214A, 214B, 214LE, and 214RE, external fan 220, and heat exchanger 222 to form a horizontal air flow channel that extends from air channel 214C1 to air channel 214C2 through heat exchanger 222.

In operation, as shown in FIG. 2C, external fan 220 draws cooler external air (shown as a solid line) in through base 210, up through air channel 214C1, and into fan 220. External fan 220 then pushes the external air into the first exterior opening 222A of heat exchanger 222, through heat exchanger 222, and out through the second exterior opening 222B. The external air then flows down through air channel 214C2, and out through base 210.

At the same time, internal fan 224 pulls warmer internal air (shown as a dashed line) in from the central interior region of cabinet 200, where the electronic equipment is located, pushes the internal air through heat exchanger 222 to exit out through end openings 222D and 222E along the interior side walls 214LI and 214RI.

One of the advantages of the present invention is that air-to-air heat exchanger 222 of electronics cabinet 200 is effectively environmentally sealed, even when the heat exchanger or the installation of the heat exchanger is defective. This is because before any water or dust can even reach heat exchanger 222, the water or dust would first have to flow up through air flow channels 214C1 and 214C2.

Another advantage of the present invention is that electronics cabinet 200 can handle an increased heat load or, alternately, provide cooler conditions for a fixed heat load. The extra cooling capacity results from pulling the external air in through and along the side walls, which reduces the effect of solar heating.

Figure 3:
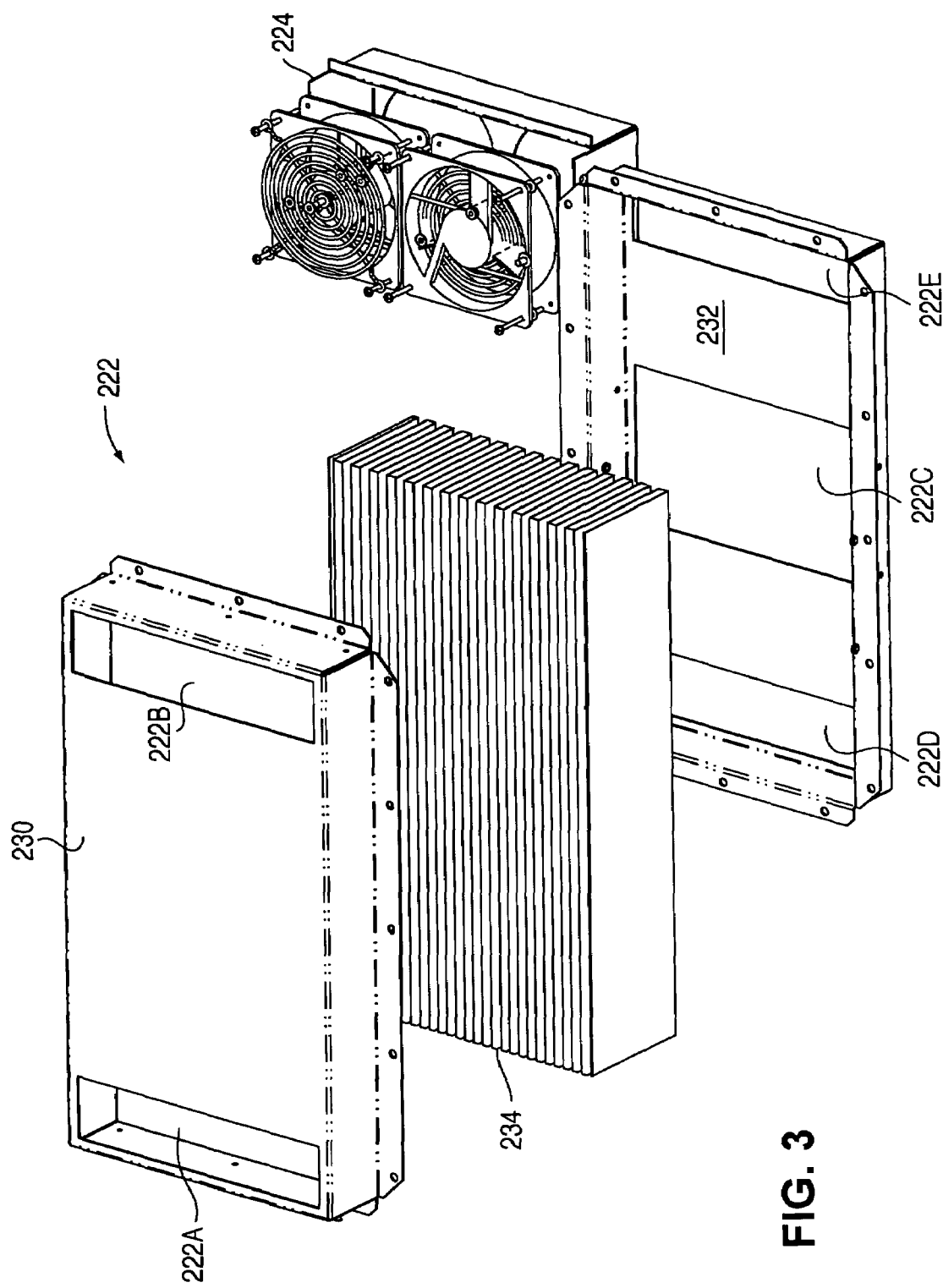
FIG. 3 is an exploded view illustrating an example of heat exchanger 222 in accordance with the present invention.

FIG. 3 shows an exploded view that illustrates an example of heat exchanger 222 in accordance with the present invention. As shown in FIG. 3, heat exchanger 222 includes a top plate 230 that has exterior openings 222A and 222B, and a bottom plate 232 that has interior openings 222C, 222D, and 222E.

As further shown in FIG. 3, heat exchanger 222 includes an air flow structure 234 that directs the flow of external and internal air through heat exchanger 222. Air flow structure 234, in turn, is a single corrugated metal sheet which forms a number of grooves or fins which are only assessable from the top side, and a number of grooves or fins which are only assessable from the bottom side. The top-side and bottom-side grooves or fins, in turn, share common side walls.

Thus, when air flow structure 234 is inserted into and covered by the top and bottom plates 230 and 232, cooler external air enters through exterior opening 222A, flows through the grooves or fins on the top side of air flow structure 234, and exits through exterior opening 222B. At the same time, warmer internal air enters through central opening 222C via internal fan 224, flows through the grooves or fins on the bottom side of air flow structure 234, and exits through the two end openings 222D and 222E. Heat transfer then takes places between the common side walls that separate the top-side from the bottom-side grooves or fins.

It should be understood that the above descriptions are examples of the present invention, and that various alternatives of the invention described herein may be employed in practicing the invention. For example, although the present invention has been described in terms of an electronics cabinet that needs to eliminate internal heat generated by POTS and xDSL line cards, the present invention applies equally to cabinets that need to eliminate heat generated by other types of electronics, as well as other-types of cabinets that enclose a heat generating source. Thus, it is intended that the following claims define the scope of the invention and that structures and methods within the scope of these claims and their equivalents be covered thereby.

What is claimed is:

1. An electronics cabinet comprising:
    an enclosure having:
        a bottom surface;
        a top surface having an opening formed through the top surface;
        a front side wall connected to the bottom and top surfaces;
        a back side wall connected to the bottom and top surfaces;
        a first interior side wall connected to the front and back side walls, the first interior side wall being substantially vertical; and
        a second interior side wall connected to the front and back side walls, the second interior side wall being substantially vertical;
    a first exterior side wall connected to the front and back side walls to form a first air channel between the first interior and first exterior side walls;
    a second exterior side wall connected to the front and back side walls to form a second air channel between the second interior and second exterior side walls;
    a heat exchanger, a portion of the heat exchanger to extend through the opening in the top surface, the heat exchanger having:

a corrugated air-flow structure having a plurality of first corrugated openings and a plurality of second corrugated openings, a plate having a first external opening, and a spaced apart second external opening that contacts the corrugated air-flow structure so that the first and second external openings expose the plurality of first corrugated openings, and a plate having a first internal opening, a spaced-apart second internal opening, and a spaced-apart third internal opening that contacts the corrugated air-flow structure so that the first, second, and third internal openings expose the plurality of second corrugated openings, the first internal opening lying between the second and third internal openings, a fan to force air to flow up the first air channel, through the heat exchanger, and down the second air channel; and a top cover that contacts the top surface, and covers the heat exchanger and the fan, an external air flowing up the first channel flows into the first external opening of the heat exchanger, through the first corrugated openings in the corrugated air-flow structure, and out the second external opening of the heat exchanger, an internal air flowing into the first internal opening flows through the plurality of second corrugated openings, and out through the second and third internal openings.

2. The cabinet of claim 1 and further comprising a fan unit connected to the first internal opening.

3. The cabinet of claim 2 wherein the fan unit forces internal air into the first internal opening, through the heat exchanger, and out the second internal opening.

4. The cabinet of claim 3 wherein the external air and the internal air contact opposite sides of a common wall in the heat exchanger.

5. The cabinet of claim 3 wherein the external air and the internal air are never mixed with each other.

6. The cabinet of claim 1 wherein the enclosure has an access opening, and is air tight and water tight when the access opening is closed.

7. The cabinet of claim 1 wherein the fan contacts the top surface.

8. The cabinet of claim 1 wherein the fan contacts the top cover.

* * * * *